US006523560B1

(12) United States Patent
Williams et al.

(10) Patent No.: US 6,523,560 B1
(45) Date of Patent: Feb. 25, 2003

(54) MICROVALVE WITH PRESSURE EQUALIZATION

(75) Inventors: Kirt R. Williams, Portola Valley; Bert P. van Drieenhuizen, Fremont, both of CA (US); Dominik P. Jaeggi, Zurich (CH); Nadim I. Maluf, Mountain View, CA (US); Edward N. Fuller, Manchester; Richard J. Barron, Ann Arbor, both of MI (US)

(73) Assignee: General Electric Corporation, Fairfield, CT (US)

( * ) Notice: Subject to any disclaimer, the term of this patent is extended or adjusted under 35 U.S.C. 154(b) by 0 days.

(21) Appl. No.: 09/326,931

(22) Filed: Jun. 4, 1999

Related U.S. Application Data (63) Continuation-in-part of application No. 09/148,026, filed on Sep. 3, 1998.

(51) Int. Cl.[7] ............................................. F16K 31/02
(52) U.S. Cl. ...................... 137/14; 251/11; 251/129.06; 251/129.07; 251/368; 303/116.1; 303/119.2
(58) Field of Search .............. 60/527, 528; 251/129.06, 251/129.07, 129.08, 368, 11, 281–283, 231, 301, 87, 88; 137/591.17, 596, 625.4, 625.42, 625.44, 625.45, 625.65, 505.18, 601.02, 14; 303/119.2, 119.3; 310/306, 307, 310

(56) References Cited

U.S. PATENT DOCUMENTS

| 886,045 A | 4/1908 | Ehrlich et al. |
|---|---|---|
| 1,886,205 A | 11/1932 | Lyford |
| 1,926,031 A | 9/1933 | Boynton |
| 2,412,205 A | 12/1946 | Cook |
| 2,504,055 A | 4/1950 | Thomas |
| 2,840,107 A | 6/1958 | Campbell |
| 2,875,779 A | 3/1959 | Campbell |
| 3,031,747 A | 5/1962 | Green |
| 3,729,807 A | 5/1973 | Fujiwara |
| 3,747,628 A | 7/1973 | Holster et al. |
| 3,860,949 A | 1/1975 | Stoeckert et al. |
| 4,005,454 A | 1/1977 | Froloff et al. |
| 4,019,388 A | 4/1977 | Hall, II et al. |
| 4,023,725 A | 5/1977 | Ivett et al. |

(List continued on next page.)

FOREIGN PATENT DOCUMENTS

| DE | 2215526 A | 10/1973 |
|---|---|---|
| DE | 2930779 A1 | 2/1980 |
| DE | 340104 A1 | 7/1985 |

(List continued on next page.)

OTHER PUBLICATIONS

Nonworolski et al., "Process for in–plane and out–of–plane single–crystal–silicon thermal microactuators", Sensors and Actuators A. Ch, Elsevier Sequoia S.A. Lausanne, vol. 55, No. 1, 1996, pp. 65–69.*

(List continued on next page.)

Primary Examiner—Jack Lavinder
Assistant Examiner—Robert A. Siconolfi
(74) Attorney, Agent, or Firm—Morrison & Foerster LLP (57) ABSTRACT

Disclosed is a microvalve suitable for use in high pressure applications such as refriigeration. The microvalve has a displaceable member that slides across an inlet port, thereby creating an orifice. A pressure-equalizing contour is positioned beneath the displaceable member and is in fluid contact with the inlet port. The pressure on the displaceable member from the inlet port is equalized by the pressure from the pressure-equalizing contour. Consequently, the microvalve can be configured with its inlet port and outlet port on opposite sides of the microvalve. Pressures in the x and y direction are also equalized because of recesses that permit fluid from the inlet to contact all faces of the displaceable member.

35 Claims, 9 Drawing Sheets

U.S. PATENT DOCUMENTS

| | | | |
|---|---|---|---|
| 4,152,540 A | | 5/1979 | Duncan et al. |
| 4,181,249 A | | 1/1980 | Peterson et al. |
| 4,298,023 A | | 11/1981 | McGinnis |
| 4,341,816 A | | 7/1982 | Lauterbach et al. |
| 4,434,813 A | | 3/1984 | Mon |
| 4,581,624 A | | 4/1986 | O'Connor |
| 4,628,576 A | | 12/1986 | Giachino et al. |
| 4,647,013 A | | 3/1987 | Giachino et al |
| 4,661,835 A | | 4/1987 | Gademann et al. |
| 4,772,935 A | | 9/1988 | Lawler et al. |
| 4,821,997 A | | 4/1989 | Zdeblick |
| 4,824,073 A | | 4/1989 | Zdeblick |
| 4,826,131 A | * | 5/1989 | Mikkor ................... 251/368 |
| 4,828,184 A | | 5/1989 | Gardner et al. |
| 4,869,282 A | | 9/1989 | Sittler et al. |
| 4,938,742 A | | 7/1990 | Smits |
| 4,943,032 A | | 7/1990 | Zdeblick |
| 4,959,581 A | | 9/1990 | Dantlgraber |
| 4,966,646 A | | 10/1990 | Zdeblick |
| 5,029,805 A | | 7/1991 | Albarda et al. |
| 5,037,778 A | | 8/1991 | Stark et al. |
| 5,050,838 A | | 9/1991 | Beatty et al. |
| 5,054,522 A | | 10/1991 | Kowanz et al. |
| 5,058,856 A | | 10/1991 | Gordon et al. |
| 5,061,914 A | | 10/1991 | Busch et al. |
| 5,064,165 A | | 11/1991 | Jerman |
| 5,065,978 A | * | 11/1991 | Albarda et al. ............. 251/368 |
| 5,066,533 A | | 11/1991 | America et al. |
| 5,069,419 A | | 12/1991 | Jerman |
| 5,074,629 A | | 12/1991 | Zdeblick |
| 5,082,242 A | | 1/1992 | Bonne et al. |
| 5,096,643 A | | 3/1992 | Kowanz et al. |
| 5,116,457 A | | 5/1992 | Jerman |
| 5,131,729 A | | 7/1992 | Wetzel |
| 5,133,379 A | | 7/1992 | Jacobsen et al. |
| 5,142,781 A | * | 9/1992 | Mettner et al. ......... 29/890.124 |
| 5,161,774 A | * | 11/1992 | Engelsdorf et al. .... 251/129.07 |
| 5,169,472 A | | 12/1992 | Goebel |
| 5,176,358 A | | 1/1993 | Bonne et al. |
| 5,177,579 A | | 1/1993 | Jerman |
| 5,178,190 A | | 1/1993 | Mettner |
| 5,179,499 A | * | 1/1993 | MacDonald et al. |
| 5,180,623 A | | 1/1993 | Ohnstein |
| 5,197,517 A | | 3/1993 | Perera |
| 5,209,118 A | | 5/1993 | Jerman |
| 5,215,244 A | | 6/1993 | Buchholz et al. |
| 5,216,273 A | | 6/1993 | Doering et al. |
| 5,217,283 A | | 6/1993 | Watanabe |
| 5,238,223 A | | 8/1993 | Mettner et al. |
| 5,244,537 A | | 9/1993 | Ohnstein |
| 5,267,589 A | | 12/1993 | Watanabe |
| 5,271,431 A | | 12/1993 | Mettner et al. |
| 5,271,597 A | | 12/1993 | Jerman |
| 5,309,943 A | | 5/1994 | Stevenson et al. |
| 5,325,880 A | * | 7/1994 | Johnson et al. ................ 60/528 |
| 5,333,831 A | | 8/1994 | Barth et al. |
| 5,336,062 A | | 8/1994 | Richter |
| 5,355,712 A | | 10/1994 | Peterson et al. |
| 5,368,704 A | | 11/1994 | Madou et al. |
| 5,375,919 A | | 12/1994 | Furuhashi |
| 5,400,824 A | * | 3/1995 | Gschwendtner .............. 251/82 |
| 5,417,235 A | | 5/1995 | Wise et al. |
| 5,445,185 A | | 8/1995 | Watanabe et al. |
| 5,458,405 A | | 10/1995 | Watanabe |
| 5,553,790 A | | 9/1996 | Findler et al. |
| 5,566,703 A | | 10/1996 | Watanabe et al. |
| 5,577,533 A | | 11/1996 | Cook, Jr. |
| 5,785,295 A | * | 7/1998 | Tsai ..................... 251/129.06 |
| 5,810,325 A | | 9/1998 | Carr |
| 5,838,351 A | | 11/1998 | Weber |
| 5,848,605 A | | 12/1998 | Bailey et al. |
| 5,873,385 A | | 2/1999 | Bloom et al. |
| 5,909,078 A | * | 6/1999 | Wood ........................ 310/307 |
| 5,926,955 A | | 7/1999 | Kober |
| 5,941,608 A | | 8/1999 | Campau et al. |
| 6,019,437 A | * | 2/2000 | Barron et al. ............ 303/116.1 |
| 6,105,737 A | | 8/2000 | Weigert et al. |

FOREIGN PATENT DOCUMENTS

| | | | |
|---|---|---|---|
| DE | 4101575 A1 | * | 7/1992 |
| DE | 4417251 A1 | * | 11/1995 |
| DE | 4422942 A1 | * | 1/1996 |
| EP | 0250948 | | 1/1988 |
| EP | 0261972 | | 3/1988 |
| GB | 2238267 A | | 5/1991 |
| WO | WO 99/16096 | * | 4/1999 |

OTHER PUBLICATIONS

Ayón et al. "Etching Characteristics and Profile Control in a Time–Multiplexed ICP Etcher" *Proc. of Solid State Sensor and Actuator Workshop* Hilton Head SC, (Jun. 1998) 41–44.

Bartha et al. "Low Temperature Etching of Si in High Density Plasma Using $SF_6/O_2$" *Microelect. Engin.* (1995) 27:453–456.

Fung et al. "Deep Etching of Silicon Using Plasma" *Proc. of the Workshopon Micromachining and Micropackaging of Transducers* (Nov.7–8, 1984) 159–164.

Klaasen et al. "Silicon Fusion Bonding and Deep Reactive Ion Etching; A New Technology for Microstructures" *Proc., Transducers 95* Stockholm Sweden (1995) 556–559.

Linder et al. "Deep Dry Etching Techniques as a New IC Compatible Tool for Silicon Micromachining" *Proc,. Transducers 91* (Jun. 1991) 524–527.

Petersen et al. "Surfaced Micromachined Structures Fabricated with Silicon Fusion Bonding" *Proc., Transducers 91*, (Jun. 1992) pp. 397–399.

Yunkin et al. "Highly Anisotropic Selective Reactive Ion Etching of Deep Trenches in Silicon" *Microelect. Engin.* (1994) 23:373–376.

Author Unknown. (Sep./Oct. 1999). "HiTecMetal Group Develops Niche Market for Brazed Laminated Assemblies," *Fluid Power Journal* 27.

Bartha, J.W., et al., (1995). "Low Temperature Etching of Si in High Density Plasma Using $SF_6/O_2$," *Microelectronic Engineering*, 27:453–456.

Carpenter Technology Corporation Tehcnical Data sheet for "Carpenter Low Expansion ;42", date Nov. 1980 <http://www.carpenter.idesinc.com/datasheet.asp?e=181&u=e VIEW=PRINTER> (visited on Mar. 28, 2002). (4 pages total).

Delphi Automotive Systems product brochure (1997). Variable Bleed Solenoid (VBS) for Transmission, copyright 1997. (2 pages total).

Delphi Automotive Systems product brochure (1998). On/Off Transmission Solenoids, copyright 1998. (2 pages total).

Duffy, James E. (1994). "Automatic Transmission Fundamentals," Modern Automotive Technology, copyright 1994, p. 707.

Fung, C.D., et al. (Nov. 7–8, 1984). "Deep Etching of Silicon Using Plasma," *Proceedings of the Workshop on Micromachining and Micropackaging of Transducers*, pp. 159–164.

Houston, P. N. et al., (Jun. 1–4, 1999). "Low Cost Flip Chip Processing and Reliability of Fast–Flow, Snap–Cure Underfills," 1999 Electronic Components and Technology Conference. San Diego, CA, pp. 61–70.

Jonsmann, J. et al., (Jan. 17–21, 1999). "Compliant Electro–thermal Microactuator" *Twelfth IEEE International Conference on Mico Electro Mechanical Systems* Orlando, Florida, IEEE Technical Digest entitled IEEE Catalog No. 99CH36291C pp. 588–593.

Klaasen, E.H. et al.(1995). "Silicon Fusion Bonding and Deep Reactive Ion Etching; A New Technology for Microstructures," *Proc. Tranducers 95 Stockholm Sweden* pp. 556–559.

Konarski, Mark M. (May 31 to Jun. 4, 1998). "Cure Parameter Effects on the Tg and CTE of Flip Encapsulants," *43rd International SAMPE Symposium and Exhibition. Materials and Process Affordability. Keys to the Future.* Anaheim, CA, vol. 1 pp. 823–32.

Linder, C. et al. (Jun. 1991). "Deep Dry Etching Techniques as a new IC Compatible Tool for Silicon Micromachining," *Proceedings, Trandsducers '91* pp. 524–527.

Madou, Marc (1997). "Scaling Laws, Actuators, and Power in Miniaturization," Chapter 9 In *Fundamentals of Microfabrication* CRC Press LLC: Boca Raton, FL., pp. 405–446.

Ohio State University Chemistry Department brochure page on Marc J. Madou [online]. Ohio State University [retrieved on Dec. 31, 2000]. Retrieved from the Internet: <URL: http://www.chemistry.ohio–state.edu/resource/pubs/brochure/madou.htm>. (2 pages total).

Petersen, K.E. et al.,(Jun. 1991). "Surface Micromachined Structures Fabricated with Silicon Fusion Bonding," *Proceedings, Transducers '91* pp. 397–399.

Qi, J. and Johnson, W. et al., (Apr. 6–9 1999) "Flip Chip on Laminate Manufacturability," 1999 International Conference on High Density Packaging and MCMs. Proc. SPEI –Int. Soc. Opt. Eng. (USA), Denver, CO., pp. 345–352.

Williams, K. R. et al. (Jun. 7–10, 1999). "A Silicon Microvalve for the Proportional Control of Fluids," Transducers '99 Sendai, Japan., pp. 1804–1807.

Yunkin, V.A., et al., (1994). "Highly Anisotropic Selective Reactive Ion Etching of Deep Trenches in Silicon," *Microelectronic Engineering* 23:373–376.

* cited by examiner

Cross Section of Valve in Package

FIG._3

Pressure-Force Balancing

MICROVALVE WITH PRESSURE EQUALIZATION

CROSS-REFERENCE TO RELATED APPLICATIONS

This application is a continuation-in-part application of U.S. Ser. No. 09/148,026, filed Sep. 3, 1998 pending, which application is incorporated by reference in its entirety herein as if fully put forth below.

BACKGROUND

It has been very difficult to provide a microvalve that can process fluids having high pressures such as those pressures used in refrigeration valves. The very small size of microvalves, such as those formed using typical semiconductor fabrication machinery, methods, and supplies, limits the amount of pressure that microvalves can handle. The small components of a microvalve are easy to move or deflect, and comparatively large forces are needed to maintain valves in a desired position or to move a valve to a new position.

Components within a microvalve can stick or rub against stationary portions because of the small clearances within microvalves and because of fluid flow buffeting portions of the microvalves. Further, differential pressures (such as those between or created by the difference in pressure between the inlet and the outlet of the microvalve) can easily push movable portions into undesired positions. Differential pressure can push movable portions against stationary portions of the microvalve, causing the movable portions to stick. Differential pressure can push movable portions opened or closed, causing great difficulties in regulating flow through the microvalve. These problems continue to arise in microvalves today, especially microvalves capable of handling high pressures.

What has been needed is a microvalve that opens and closes easily with little or no "stiction" and with little resistance from the fluid being controlled despite the fluid being at high pressure, that is easily regulated and responds in linear fashion to a driving force, and that has a long lifetime.

Further, brittle adhesives have been used in high pressure microvalves to adhere the microvalve to other equipment. The brittle adhesives can crack and break well before other components of the microvalve have failed. Consequently, there is a need for a microvalve that does not require a brittle adhesive.

SUMMARY OF THE INVENTION

The invention provides a micromechanical flow valve for controlling the flow of a liquid or gas. The microvalve can be configured to control the flow of fluids having a pressure of less than 1 bar to in excess of 300 bar.

The microvalve is designed to have equal pressures on all faces of the slider that controls flow through the microvalve, so that energy supplied to move the slider is not wasted on overcoming resistance to slider movement caused by fluid pressure. The microvalve comprises a body having an inlet, an outlet, and a channel within the body that is in fluid communication with the inlet and the outlet. A slider that controls fluid flow also resides within the body and is moved by an actuator that is part of or is attached to the body. The slider has a channel through it from a first face to a second face that allows fluid from the inlet to communicate with a pressure-equalizing contour beneath the slider. Fluid in this pressure-equalizing contour has the same pressure as the fluid in the inlet, and consequently the pressure on the first face of the slider is equal to the pressure on the second face of the slider.

Further, the other faces of the slider are in fluid communication with one another, so that all remaining faces experience the same pressure regardless of whether the valve is partially or fully opened or closed. Because pressures are balanced on all faces of the slider, the energy supplied by the actuator is used only to move the slider and not also to overcome a pressure force on the slider.

The microvalve preferably has an actuator formed from tapered ribs that are joined to the displaceable member by a tie-rod that forms part of the actuator. A second tie-rod is attached to the material of the second layer and also to the displaceable member, forming a fulcrum or flexure on which the displaceable member pivots. Preferably, both tie-rods are attached to the same side of the displaceable member to prevent the tie-rods from assuming an "S" shape when the displaceable member is moved.

In one preferred embodiment, the microvalve is configured as a flow control valve for high pressure applications as are found in automobile automatic transmissions or anti-lock braking systems. The flow opening is sized to provide the desired flow range or pressure drop, so the ports, channel, and/or slider have a shape and configuration provide the flow area range needed for the desired flow rate range.

In another preferred embodiment, the microvalve is configured as a refrigerant microvalve by providing a flow rate at which the expansion or cooling of a refrigerant fluid is controlled. The size of the flow opening is controlled so that there is a sufficiently high pressure drop as the fluid flows through the microvalve to provide the desired extent of cooling. The size of the flow opening can be controlled by positioning the displaceable member so that most of the inlet port is blocked, leaving a small strip of the inlet port open for fluid flow. The fluid may or may not change phase, so that liquid passing through the microvalve may either remain as a liquid or may partially or fully evaporate to form a gas.

The invention also provides a method of making a microvalve. An inlet, outlet, and fluid passage are formed within a housing, and a lever arm having a slider capable of blocking at least a portion of the fluid passage is also formed within the housing along with an actuator to move the lever arm. A deep fluid pressure-equalizing contour is positioned within the housing beneath the slider, so that fluid entering the inlet and pressing against the slider from above also enters the deep fluid pressure-equalizing contour beneath the slider and presses against the slider from below, thereby equalizing the forces on the slider in the z direction.

The invention also provides a method of using the pressure of a fluid to provide a microvalve that is capable of operating at high pressure. By providing a deep fluid pressure-equalizing contour positioned beneath at least a portion of the slider as described above, forces on the slider are equalized in the z direction, and little force is needed to shut or open the microvalve.

Among other factors, the invention is based on the technical finding that a microvalve that incorporates a slider and has deep pressure-equalizing contours above and below the slider as well as a channel through the slider to allow fluid from the inlet to fill the pressure-equalizing contour below the slider has pressures balanced in all three directions −x, y, and z−, making the valve easier to control and to regulate than previous designs such as micromachined seat valves.

Consequently, an easily- and well-controlled microvalve having inlet and outlet on opposite sides of the microvalve can be fabricated, and the flow path can be linear, without turns or obstructions other than the slider, so that the slider is subjected to little force or buffeting caused by the fluid changing path within the microvalve. The flow response of the valve can be linear because of the linear relationship between the area of the flow opening controlled by the slider and flow rate, and the linear relationship between the voltage used to control the position of the slider and the area of the flow opening. The valve is capable of handling pressures in excess of 300 bar, if desired. Further. the microvalve can easily be configured as a normally open or normally closed valve, and both types of valve can easily be fabricated on the same substrate. Ribs of the actuator for the slider have improved stress resistance when the ribs are gradually tapered, so that the width of each rib at its center is greater than the width of the rib at its top. In addition to the above findings, a pliable adhesive can be used to adhere the microvalve to other equipment. These technical findings and others are apparent from the discussion herein.

BRIEF DESCRIPTION OF THE FIGURES

FIG. 1 illustrates a micromachined refrigerant microvalve having an opposing inlet and outlet and having balanced forces in the x, y, and z directions.

FIG. 2 illustrates a refrigerant microvalve much as in FIG. 1 but having tapered ribs and push rods that flex without forming compound bends. FIG. 2(b) also shows that the width of the rib at its center is greater than the width at its ends, where the rib is attached to the layer and the tie-rod, respectively.

DETAILED DESCRIPTION OF THE PREFERRED EMBODIMENT

The description herein is presented to enable a person of ordinary skill in the art to make and use the invention. Descriptions of specific applications are representative of types of applications to which the invention may be placed, but the invention is not limited to the specific applications discussed herein. Various modifications to the preferred embodiment will be readily apparent to those skilled in the art, and the general principles defined herein may be applied to other embodiments and applications without departing from the spirit and scope of the invention. Thus, the present invention is not limited to the embodiments shown, but is to be accorded the widest scope consistent with the principles and features disclosed herein.

FIG. 1 illustrates a micromachined refrigerant microvalve 1000 having an inlet port 20 formed in third layer 16 and an opposing outlet port 22 formed in first layer 12 and having balanced forces in the x, y, and z directions. Refrigerant microvalve 1000 has ribs 48 that form thermal actuators 28 and 30 in second layer 14. The thermal actuators each have a shaft 44 and 46 to which the ribs attach. Displaceable member 26 has two end portions, a first actuator end portion 40 attached to shafts 44 and 46, and a second stopper end portion 42. Second stopper end portion 42 in this example is a "P"-shaped displaceable member or slider having a "P"-shaped extension 60 that allows the fluid to pass through the second stopper end portion. Microvalve 1000 also has a pressure-equalizing contour 1002 in first layer 12 and pressure-equalizing contour 1004 in third layer 16. Each pressure-equalizing contour has sufficient depth that the "P"-shaped extension 60 contacts a large amount of fluid on flow face 1006 and flow face 1008. Little of the "P"-shaped extension 60 contacts first layer 12. Fluid within pressure-equalizing contour 1002 acts as a pressure reservoir beneath "P"-shaped extension 60, so that the pressure the fluid exerts on flow face 1006 and flow face 1008 is equal. The deep pressure-equalizing contours 1002 and 1004 also assure that the fluid is not squeezed from beneath "P"-shaped extension 60, thus minimizing or preventing the "P"-shaped extension from sticking to or rubbing against first layer 12.

A refrigerant microvalve cools the fluid passing through the microvalve by controlling the flow to reduce the pressure of the fluid suddenly. In some cases, the pressure may drop sufficiently that a liquid passing through the microvalve evaporates. The pressure drop is created by opening the microvalve a small amount, so that the fluid is in effect passing through an orifice.

Figure 1A:
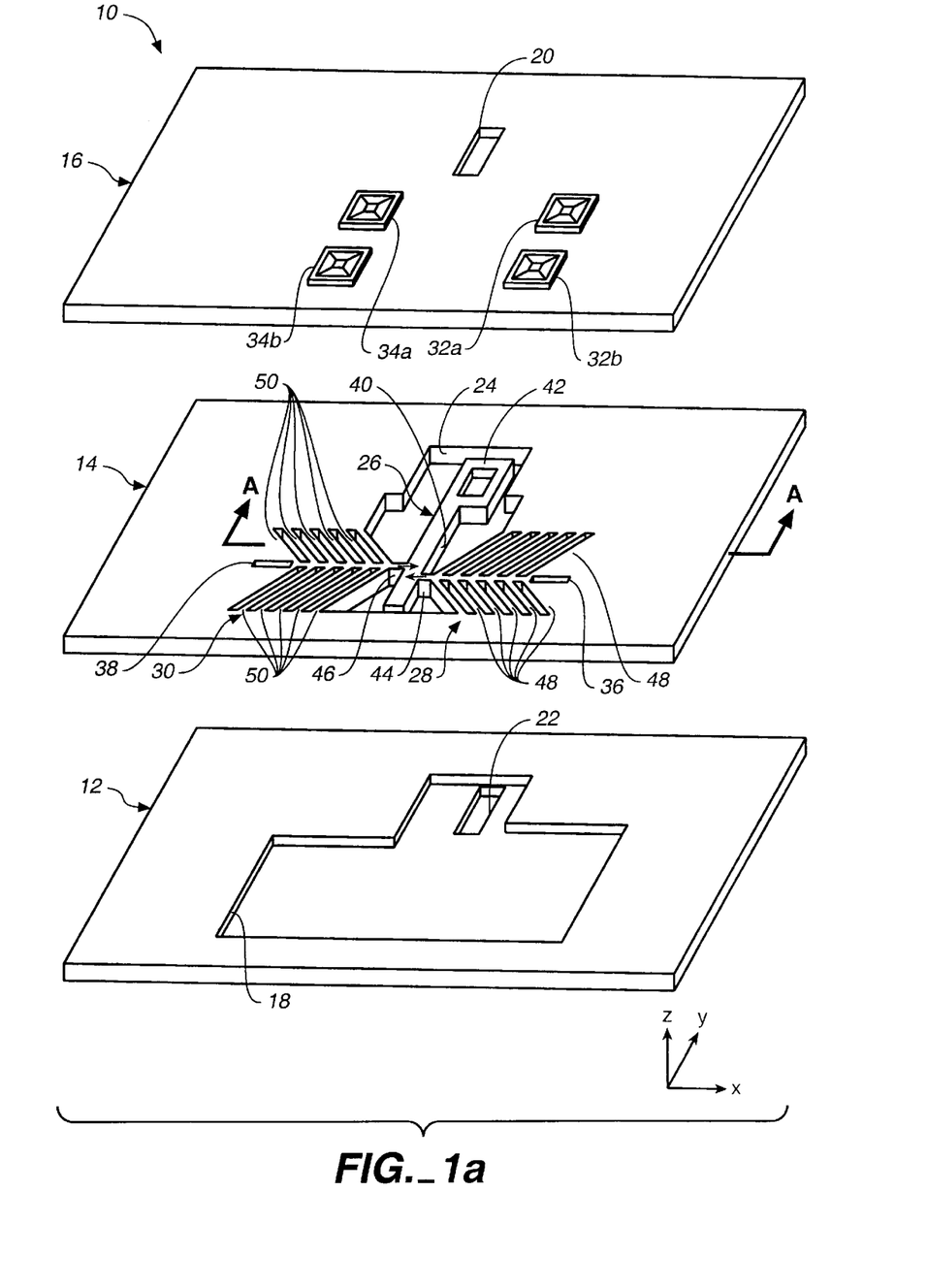
FIG. 1(a) is an exploded view, showing the three layers used to make this microvalve and the general layout of actuator, displaceable member, inlet and outlet ports, and electrical contacts or bond pads.
Figure 1B:
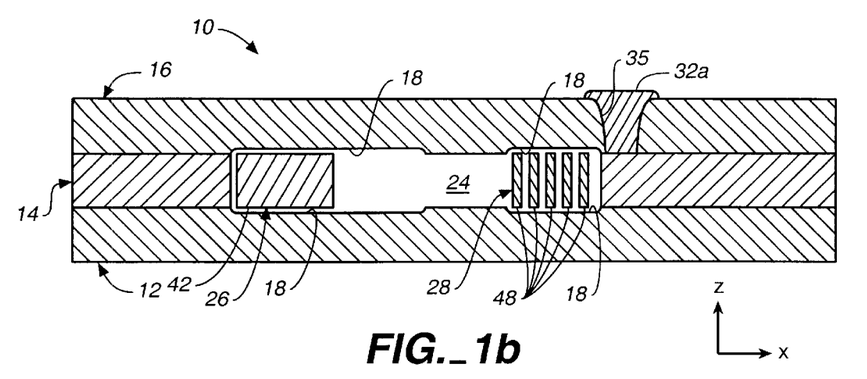
FIG. 1(b) is a cross-sectional view along a portion of line A—A of FIG. 1(a).
Figure 1C:
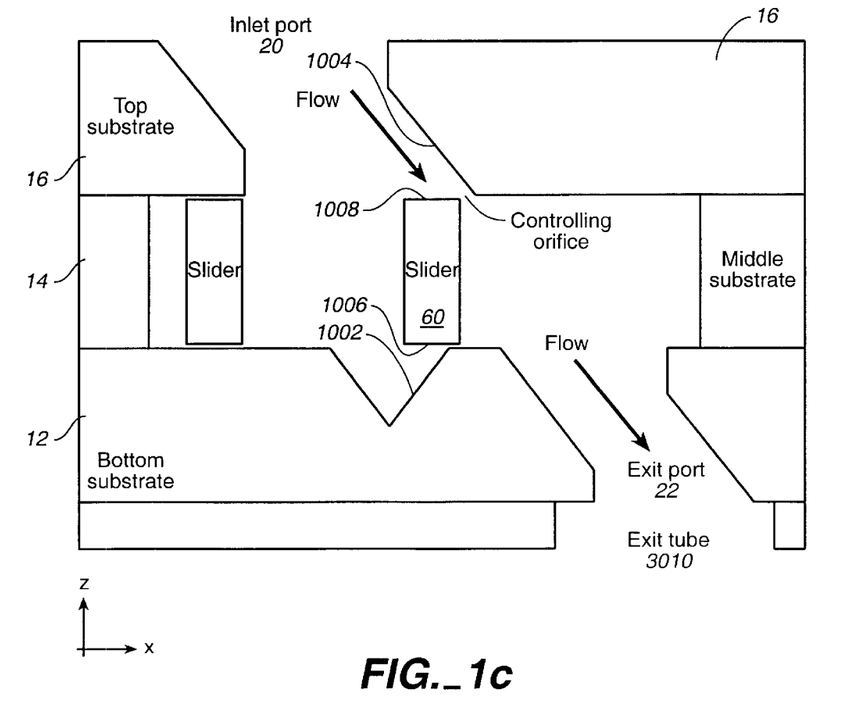
FIG. 1(c) is a cross-sectional view of the fluid flow region of the microvalve, where the top substrate and the slider form a single flow-controlling orifice.

As illustrated in FIG. 1(c) for a normally-open valve, the right-hand boundary of pressure-equalizing contour 1004 in third layer 16 lies slightly farther alone the x axis than does the right-hand boundary of pressure-equalizing contour 1002 in first layer 12. The displaceable member 26 moves sufficiently far that an upper orifice of the desired size is created by the "P"-shaped extension and the edge of pressure-equalizing contour 1004 when the "P"-shaped extension 60 moves in the x direction. The fluid pressure at the pressure-equalizing contour 1004 equals the fluid pressure at pressure-equalizing contour 1002, and consequently the pressure exerted on face 1006 of slider 60 is essentially equal to the pressure exerted on face 1008 of slider 60.

Figure 1D:
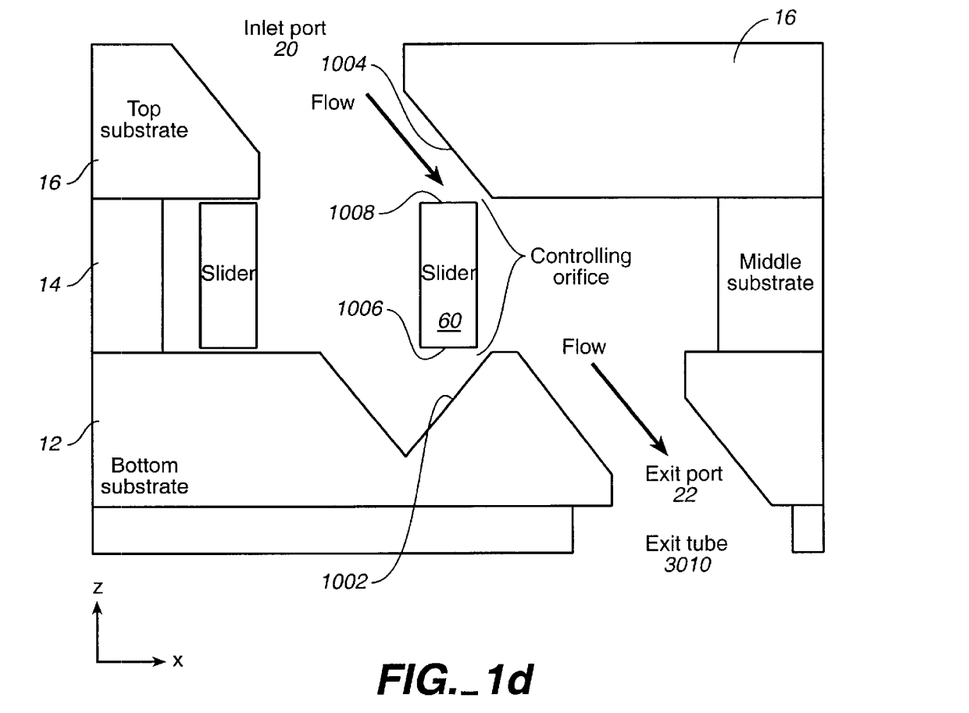
FIG. 1(d) illustrates a cross-sectional view of a variation on the microvalve of this figure, where a first flow-controlling orifice is formed by an edge of the top substrate and the top portion of the slider, and a second flow-controlling orifice is formed by an edge of the bottom substrate at the pressure-equalizing contour and the bottom portion of the slider.

Pressure-equaliziing, contour 1002 may have its right-hand boundary at the same position along the x axis as does pressure-equalizing contour 1004, as illustrated in FIG. 1(d). In this instance, two orifices are created, an upper one at the boundaries of the "P"-shaped extension and pressure-equalizing contour 1004, and a lower one at the boundaries of the "P"-shaped extension and pressure-equalizing contour 1002. The pressure drop at both edges of the "P"-shaped extension is essentially equal with this configuration.

The inlet port 20 usually has a high pressure (approximately 15 bar for a refrigerant such as R134a (tetrafluoroethylene) or R600a (isobutane), or as high as 300 bar for other applications), whereas the outlet port 22 will typically have a lower pressure. The microvalve is mounted to other equipment with its low pressure side toward the other equipment. The pressure differential across the microvalve helps to press the layers that make tip the microvalve together. The pressure differential also helps to press the microvalve to equipment to which the microvalve is mounted. Because of this, a wider range of adhesives can be employed to hold the microvalve to equipment on which the valve is mounted. Instead of using a brittle and hard but strong adhesive (e.,. epoxy) that tends to crack or break, a softer adhesive such as a silicone can be used to hold the microvalve to its mount.

The microvalve can be configured to be either normally opened or normally closed in the absence of power applied to the ribs. The flow through the microvalve is essentially proportional to the size of the opening. Consequently, the microvalve provides a flow that is proportional to the voltage applied to the electrical contacts that power the ribs.

The microvalve may otherwise be configured similarly to the microvalve of copending application 09/148,026. Preferably, each of first, second, and third layers 12, 14. and 16, respectively, is made of silicon or other semiconductor materials. Alternatively, first and/or third layers 12, 16 may be made of glass such as Pyrex® glass, conductive ceramic, steel, aluminum, and/or any other metallic or conductive materials. The second layer 14 is preferably a single-crystal semiconductor such as silicon, as it is strong, flexible, and more resistant to performance degradation.

In fact, the microvalve is preferably comprised almost entirely of single-crystal silicon (SCS), with silicon dioxide used for electrical insulation and metal for bond pads. There are several advantages to using all SCS over other materials or combinations of materials. First, an all-SCS construction is insensitive to fluctuations in ambient temperature. Second, SCS has a high ultimate tensile strength (several times that of polycrystalline silicon) and, unlike metals, does not plastically yield below about 500° C. Third, while thin films are typically limited by practical deposition rates and residual stress to thicknesses of a few micrometers, SCS layers can be made any thickness. High thickness allows the production of very high-output-force (>1 N) microactuators. Finally, unlike metals, the resistivity of the starting material can be controlled over several orders of magnitude. Thus, the resistance of an actuator of given dimensions can be selected, allowing tailoring of performance specifications of the microvalve.

The second layer 14 is preferably doped, more preferably highly doped, for example, a highly doped P-type single-crystal semiconductor (SCS). By doping, second layer 14 has a low resistivity. Low resistivity facilitates increased current flow through thermal actuators 28. 30. Current may be applied through actuators 28, 30 via contacts 32a, b and 34a, b, respectively. By increasing the current applied to contacts 32a, b and 34a, b, thermal expansion of actuators 28, 30 increases resulting in an increase of the forces exerted by actuators 28, 30 on the displaceable member 26.

For example, the resistivity p of second layer 14 is preferably approximately 0.001–0.01 Ω.cm such that a current flow from one side to the other side of ribs 48 results in a desirable amount of heating of and heat dissipation by the ribs. Where ribs 48 are silicon, ribs 48 can withstand temperatures of preferably up to approximately 500° C. Preferably, silicon ribs 48 are heated between 10° C. to 500° C. and more preferably between 50° C. to 200° C. The preferred temperature range is usually limited by the boiling point of any liquid in contact with the ribs, since it is preferable not to vaporize the liquid and build pressure within the body of the microvalve that could interfere with its operation or longevity. If the valve is used in an anti-lock braking system., the temperature is preferably less than about 288° C. and if the microvalve is used to control the flow of water, the temperature is preferably less than 100° C. As is evident, actuation of microvalve 10 is dependent upon the heating of ribs 48 relative to the temperature of the remainder of the microvalve 10 and is independent of the ambient temperature.

Thus, actuation begins by passing current through the ribs, ohmically heating them. For a given voltage across the ribs, a lower resistance results in higher input power, faster heating, and a higher steady-state temperature profile.

The ends of the ribs have a temperature at or greater than the rest of the microvalve to which the ribs are attached. In the present embodiment, the center of each rib is the hottest point. with a roughly parabolic temperature profile from end to end. Heat is conducted horizontally out the ends of the ribs and also vertically through the dead volume of fluid in which the ribs are suspended. Adjusting the size of the gap between the ribs and the top and bottom layers varies the heat loss and consequently the cooling time and heating power requirement.

After heat is conducted into the main body of the microvalve, the heat flows out to the atmosphere surrounding the microvalve. For a low microvalve temperature rise, good thermal contact is made to the bottom of the microvalve. The top of the microvalve is cooled by the fluid it contacts. When the microvalve body does heat, it has little effect on the actuator motion because the actuator relies on a temperature difference between the microvalve and the ribs.

Electrical contacts 32a–b are provided in third layer 16 and are vertically aligned with ribs 48 of thermal actuator 28 such that one of the contacts (e.g., 32a) is vertically aligned with the ribs on one side of the isolation trench 36 and the other of the contacts (e.g., 32b) is vertically aligned with the ribs on the other side of the trench 36. Electrical contacts 32a–b provide electrical contact, through vias 35, for the application of current to actuators 28. The ribs 48 serve as conductive paths through the highly doped second layer 14 between contacts 32a and 32b. Contacts 32a–b are preferably in electrical contact with regions of second layer 14 that are isolated except for current conduction paths formed by ribs 48. Such electrical isolation may be established by providing trenches 36 in the second layer 14 to prevent a short circuit between electrical contacts 32a and 32b. Trenches 36 may be filled with a dielectric material to planarize trenches 36. Alternatively, electrical isolation may be established by oxidizing the ribs 48 to prevent shorting through the fluid between electrical contacts 32a and 32b.

Additional electrical isolation between ribs 48 and ribs 50 is unnecessary because ribs 48, 50 provide the path of least resistance between contacts 32a, 32b and between contacts 34a, 34b, respectively, if each set of ribs 48, 50 is independently driven. Further, electrical isolation between first and second layers 12, 14 and between second and third layers 14, 16 is also achieved because the first and third layers 12, 16, unlike second layer 14, have a low doping level and are only minimally electrically conductive, such that the applied current remains in second layer 14. Where the layers 12, 14, 16 comprise silicon, the surface of the layers 12, 14, 16 may also be oxidized to provide further electrical isolation.

The contacts 34a, 34b are similarly vertically aligned with the ribs 50 of the actuator 30. Such vertical alignment provides a more compact microvalve.

Because the temperature rise of the ribs relative to the rest of the microvalve to which the ribs are attached can be continuously varied with input heating power, the position of the displaceable member over the orifice can be varied, allowing proportional control (i.e., the flow rate varies continuously with input signal).

Figure 2A:
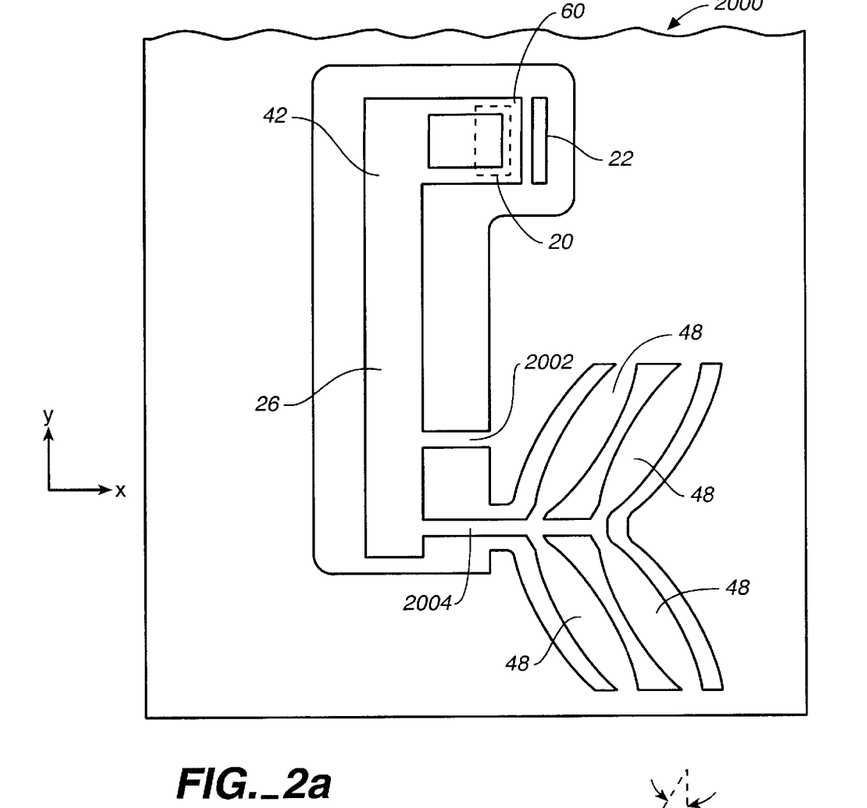
FIG. 2(a) illustrates the microvalve in its relaxed, normally-open position.
Figure 2B:
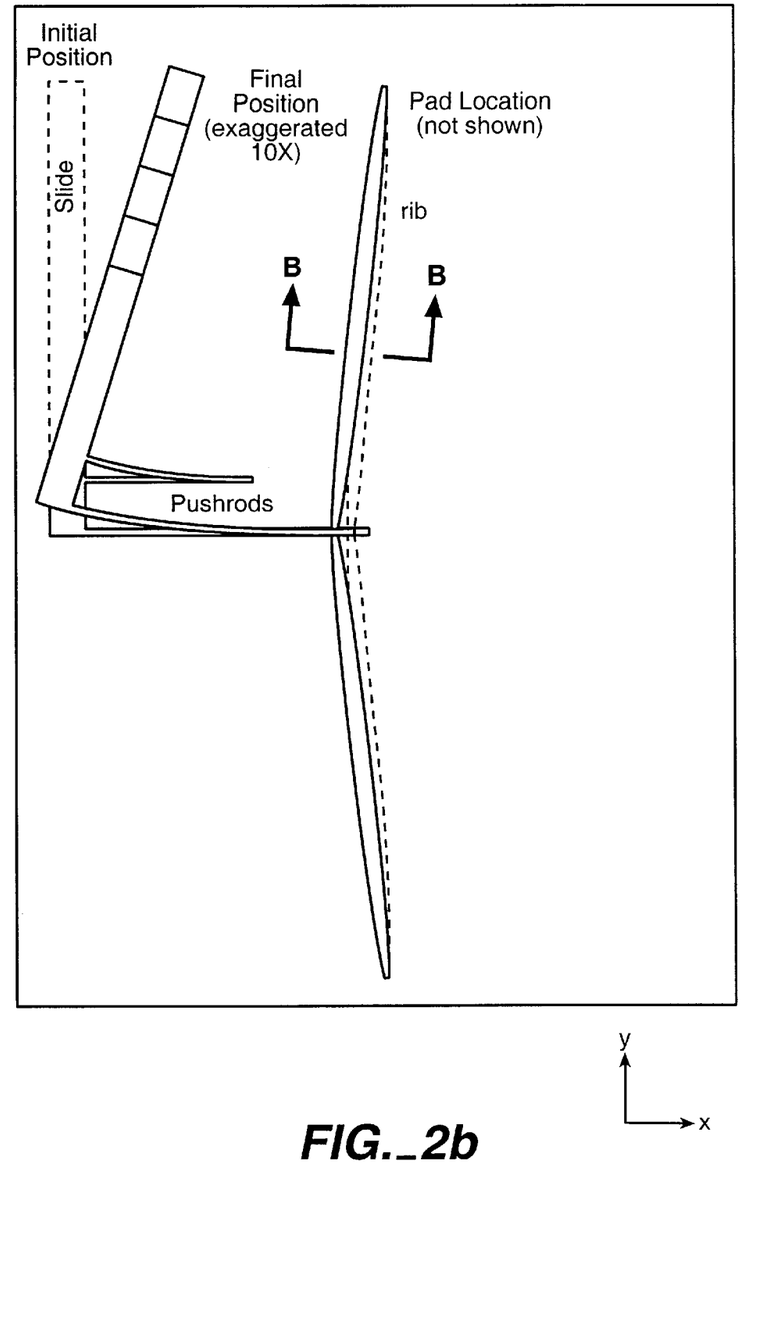
FIG. 2(b) illustrates a similar valve with the displaceable member in its closed position but exaggerated by a factor of approximately 10 to better illustrate how the displaceable member moves.
Figure 2C:
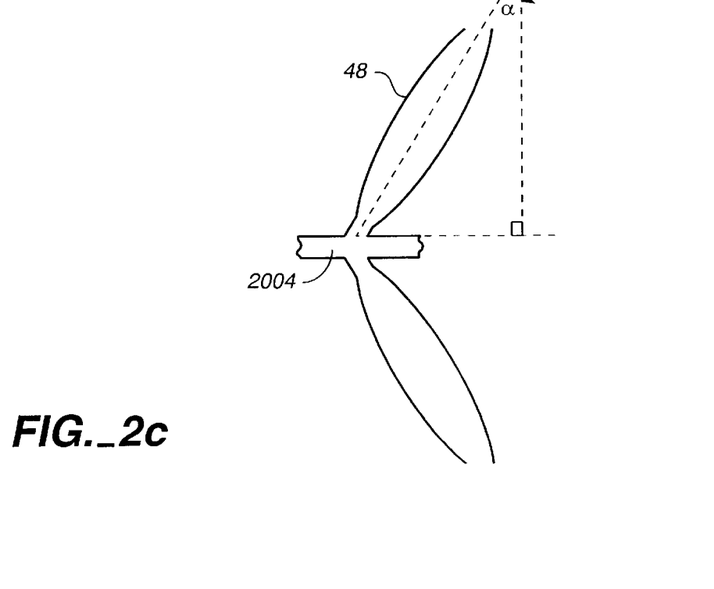
FIG. 2(c) shows the taper that is present in a rib and how the angle of taper, α, is measured when the rib is in its resting (unpowered) position.

FIG. 2(a) illustrates the second layer of a normally-open refrigerant microvalve 2000 as in FIG. 1 but having tapered ribs 48 and push rods 2002 and 2004 that flex without forming compound bends. Ribs 48 are long and tapered as shown in FIG. 2(b) and FIG. 2(c), having an angle of taper a between about one degree and about five degrees. The ribs also have thinner end portions than midsections. This rib configuration results in lower stresses on the ribs and less energy loss due to rib flexing. As in the device of FIG. 1, tapered ribs 48 are held to the second layer at one end and join with push-rod 2004 at the opposite end of the ribs. Push-rod 2004 is attached at its other end to the displaceable member 26. Push-rod 2004 thus moves in the −x direction when current is applied to tapered ribs 48, heating them. Push-rod 2002 is fixed at one end to the second layer and at its other end to displaceable member 26. Consequently, push-rod 2002 is not free to move in the x direction as push-rod 2004 is. Both push-rods are attached to the same side of the displaceable member 26. The push-rods are about 50 microns wide, and the push-rods are spaced about 50 microns from one another.

When ribs 48 heat because of the electrical current passing through them, ribs 48 expand and push movable push-rod 2004 in the −x direction. Fixed push-rod 2002 does not move in the −x direction, since it is held in place by the second layer. Both push-rods will bow and assume the shape of a simple curve or arc, moving second stopper end portion of the displaceable member in the +x direction and reducing the orifice area and thus the flow. Each push-rod is thus prevented from assuming the shape of a complex curve having two or more curves in opposite directions, which can cause unpredictable microvalve performance. This configuration of at least two push-rods attached to the same side of the displaceable member minimizes the size of the chip on which the microvalve is formed and reduces stress on the push-rods.

The ribs in these microvalves described above are nominally 385 μm thick (about the thickness of the second layer). Consequently, the forces they exert are much higher than for other micromachined thermal actuators. For ribs 100 μm wide, 2000 μm long each, angled at a few degrees, with 10 pairs placed in parallel, and having a taper between about 1 and about 5 degrees, analytical calculations and finite-element simulations show that the force output at the center of the rib pair is about 1.5 N at the start of the stroke for a 100-K average temperature rise. As the ribs move, the force output falls nearly linearly to zero at the end of the stroke, which is about 7.5 μm in this example.

For the present microvalve application, this large force and relatively small displacement are transformed into a larger displacement using a lever. Rather than using a mechanical pivot point, which would be difficult to fabricate and could pose reliability problems from parts grinding against each other, a flexure structure is used, as shown in FIG. 2. The fixed push-rod 2002 serves as the pivot point. After accounting for loss in the push-rods 2002 and 2004, the unloaded displacement of the second end of this displaceable member in the x-direction is approximately equal to the lever ratio (the member length measured from the fixed push-rod divided by the push-rod spacing) times the rib displacement. These factors can be used in designing a microvalve suitable for use in a particular application.

Figure 3:
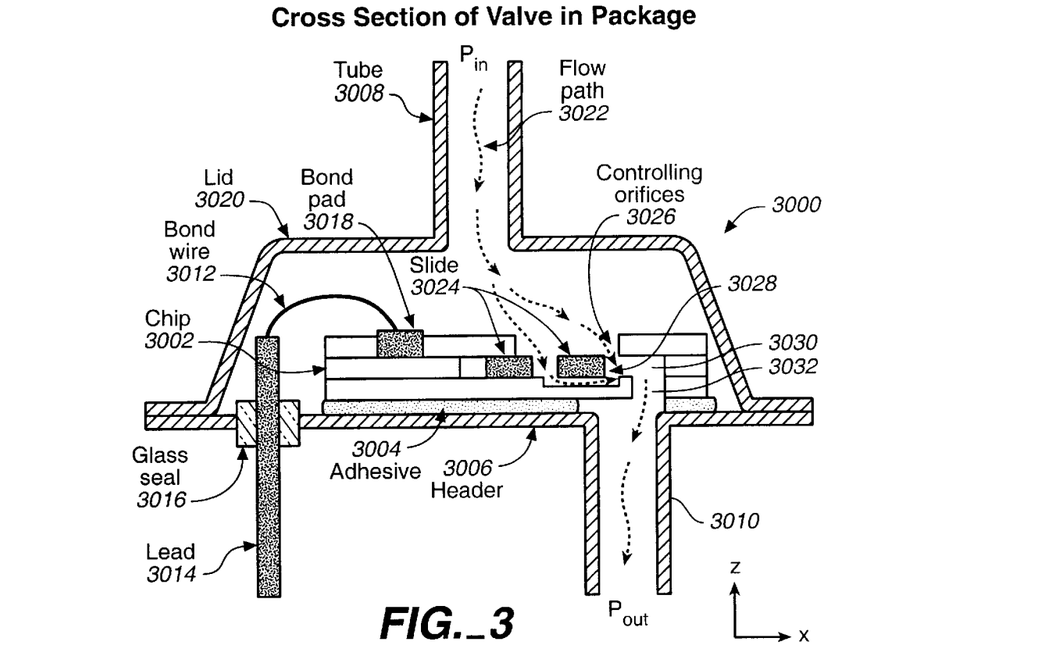
FIG. 3 illustrates a microvalve mounted to a header.

Flow enters the microvalve from the inlet port and leaves through the outlet port. This has the advantage of allowing simple packaging in a can 3000 such as a modified TO-8 header 3006 with tubes 3008 (attached to lid 3020) and 3010 as illustrated in FIG. 3. In such an arrangement, the microvalve 3002 and adhesive layer 3004 are compressed when pressurized, reducing the need for strong bonding between the microvalve 3002 and its package. Consequently, a more pliable but weaker adhesive can be used. A bond wire 3012 is carried within lead 3014 (sealed to the package by glass seal 3016) and is attached to bond pad 3018. Fluid flows along flow path 3022 and into the inlet of microvalve 3002. The slider 3024 regulates flow through the microvalve by forming variable orifices 3026 and 3028 along the corners of slider 3024 nearest passage 3030 to outlet 3032.

Figure 4:
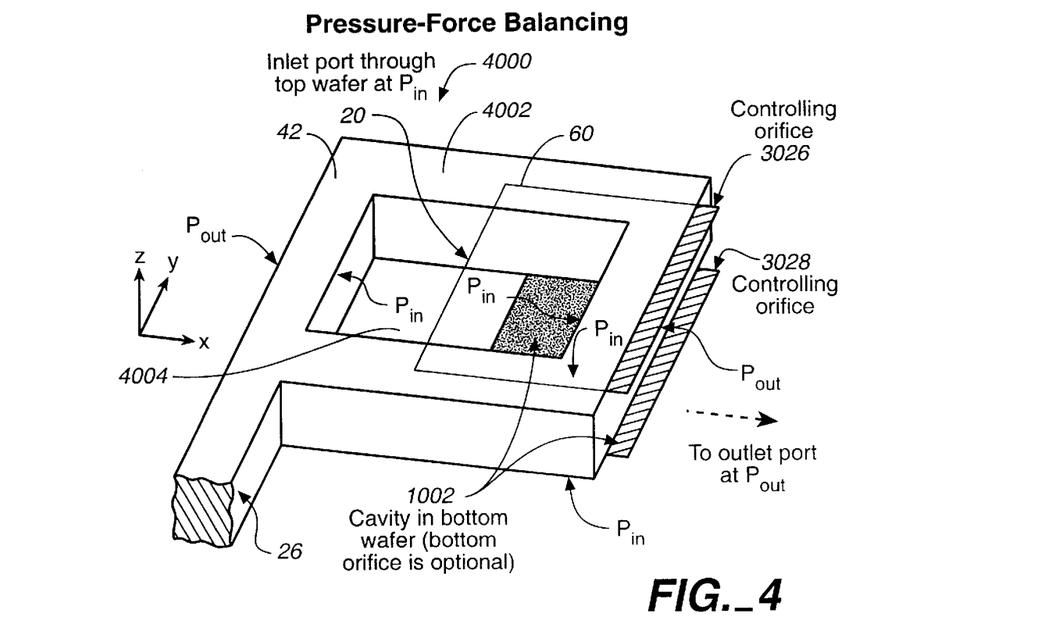
FIG. 4 illustrates a slider portion of a microvalve and how the pressure forces are balanced in x, y, and z directions.

In micromachined seat valves, the membrane must work against the force of a pressure difference acting over the orifice area. This limits the maximum operating pressure. However, the static pressure on the slider can be balanced in the microvalve design in which a slider 4000 is incorporated into the microvalve as illustrated in FIG. 4. Balancing in this embodiment was accomplished by adding pressure-balancing extension 4002 to the second end 42 of the displaceable member 26 to form a cavity 4004 so that the inlet pressure $p_{in}$ acts equally against opposing surfaces of the member in the x and y directions. The microvalve is also designed so that fluid at the outlet pressure surrounds the outside of the member so that the outlet pressure acts on opposing surfaces.

The displaceable member is also pressure-force-balanced in the vertical (z) direction by the formation of a deep pressure-equalizing contour 1002 under the leading edge of the slider. Without this balancing, friction due to the force pushing down on the displaceable member limits operation to low pressures. The deep pressure-equalizing contour 1002 allows fluid to flow from the inlet port 20, through the P-shaped displaceable member 26, and into and out of the pressure-equalizing contour 1002. Thus, because fluid pressure is exerted on both the top (1008) and bottom (1006) surfaces of the slider 60, pressure balancing is achieved in the Z direction.

As shown in FIG. 1(c), the fluid's flow is at approximately the same angle through the inlet port of the top layer, the middle layer, and the outlet port of the bottom layer (54.7 degrees relative to the horizontal plane—the angle is a function of the crystalline structure of the silicon and wet-etching a 1,0,0 silicon wafer along 1,1,1 planes; the position of: inlet and outlet ports when formed is selected to provide a straight channel through the microvalve). Minimizing or eliminating changes in direction of the fluid flow (nonbending flow) minimizes flow force exerted on the displaceable member. The portion of the displaceable member adjacent to the inlet port may also be similarly angled but would greatly increase the fabrication costs.

The volumetric flow rate Q through an orifice as is created when the second portion of the displaceable member opens a small passage for fluid to flow for an incompressible fluid is determined primarily by the pressure drop $\Delta P = P_{in} - P_{out}$, the total orifice area A. and the fluid density $\rho$. The flow rate is also affected to a small degree by the shape of the orifice, the amount of flow convergence just after exiting the orifice (the vena contracta), and the Reynolds number. These effects are taken into account in the empirical unitless discharge coefficient $C_D$ (with typical values of 0.6–0.7) in the equation $$Q = C_D A \sqrt{2\Delta p/\rho}$$

The pressure drop in the equation above is across the orifice and does not take into account viscous losses in the fluid routing entering and exiting the orifice. Computational fluid dynamics modeling using software supplied by CFDRC (Huntsville, Alabama) shows that these losses are small for the valve structures presented here, and so they can be ignored for most purposes when designing valves utilizing the principles of the invention.

Figure 5:
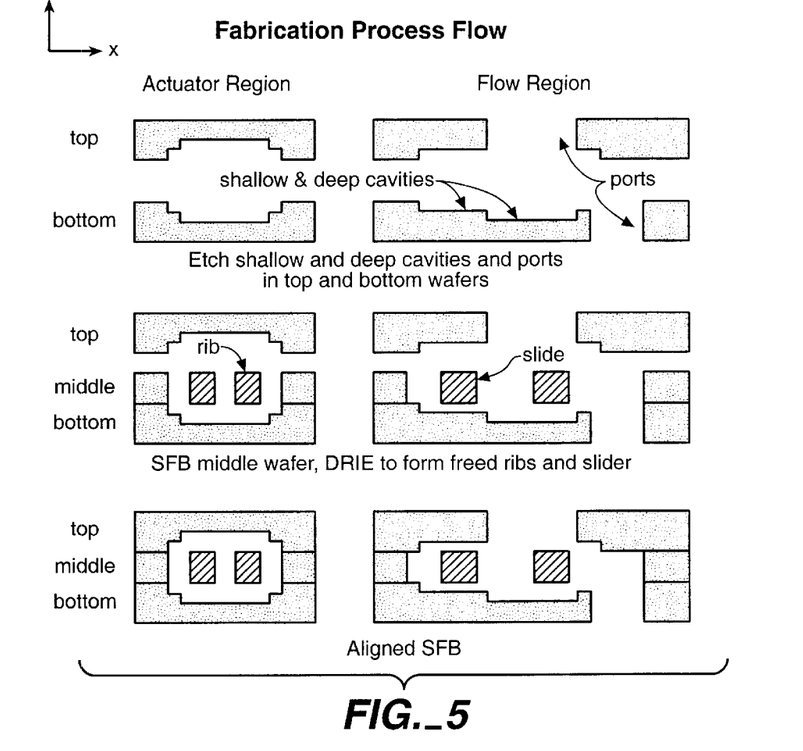
FIG. 5 illustrates various stages of manufacturing a microvalve.
Figure 6:
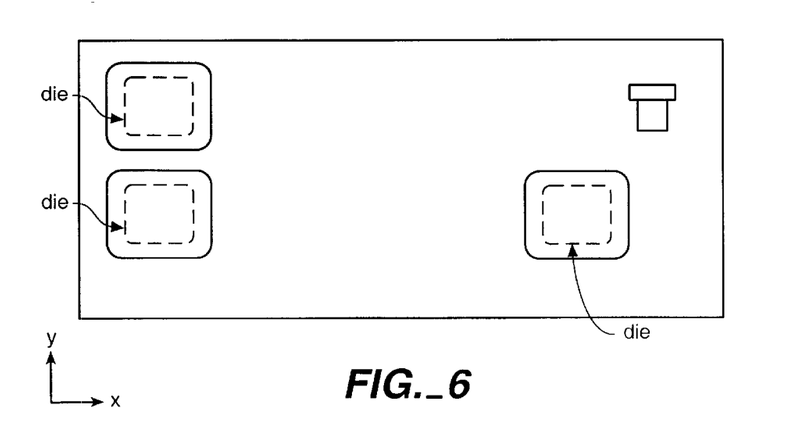
FIG. 6 is a drawing of the top portion of a microvalve, showing three die pads and the inlet port.

The microvalve fabrication process flow is shown schematically in FIG. 5. The top and bottom silicon layers are to a large degree mirror images of each other. Processing of the top and bottom wafers starts with the etching of shallow cavities over and under the future locations of all moving parts. This depth sets the gap for the fluid leakage path past the displaceable member when the microvalve is closed. Subsequent etching steps form deep thermal isolation trenches above and below the ribs in low-power microvalves. The unpatterned middle wafer is silicon fusion bonded (SFB) to the bottom wafer. A double-sided alignment and deep reactive ion etch (DRIE) form the freed actuator in the middle wafer. Aligned SFB adds the top wafer to the stack. Finally the wafer is metallized to form contracts. A drawing of the microvalve is shown in FIG. 6.

Both a normally opened and normally closed microvalve can be formed on the same chip. In this instance, photolithography is used to pattern the silicon substrates that (Ire DRIE etched to form two inlets and two outlets in the top and bottom wafers, respectively. The middle wafer is also patterned to have two sets of sliders and actuators that are individually controllable. The position of the slider formed in one of the valves is such that, when the three wafers are fusion bonded, the slider covers either the inlet or the outlet, forming a normally closed valve. The position of the other slider formed in the other valve is such that, when the three wafers are fusion bonded, the slider does not block the inlet from communicating with the outlet via the interconnecting channel in the second wafer. Both valves have very similar designs, and the only difference between the valves is the position of the slider relative to the inlet and outlet.

The microvalves are packaged in a modified TO-8 header with inlet and outlet tubes in the lid and base. The microvalves are adhered to the header with RTV adhesive. After wire bonding, the lid is resistively welded on.

A shallow (~1 micron) cavity is formed in the top and bottom layers of the silicon under all moving pairs (ribs, push-rods, displaceable member) to help prevent the moving parts from contacting an opposing silicon surface and thus to facilitate movement of these parts. Some fluid will leak from the inlet through the outlet even when the displaceable member is in a closed position because there is about 1 micron clearance between the silicon layers. The shallower the cavity, the less leakage but the treater chance that the displaceable member (or other moving part) would contact an opposing surface and stick.

A deeper (approximately 20 to approximately 300 microns) cavity may be provided under the ribs and push-rod to allow a volume of fluid to be in thermal communication with the ribs and push-rod. Increases in the temperature of the silicon increases the resistance of the silicon. To limit the temperature increase of the silicon, deeper cavities arc defined in the top and bottom layers of the device in the rib and push-rod regions such that fluid fills those cavities to act as a heat capacitor. The resistance of the silicon may be monitored by providing a third bond pad (shown in FIG. 6). Two bond pads are provided at either end of the ribs for application of current therehrough. A third bond pad may be provided at a location away from the ribs such that the resistance of the silicon can be measured using one of the two bond pads provided for the ribs and the third bond pad.

Figure 10:
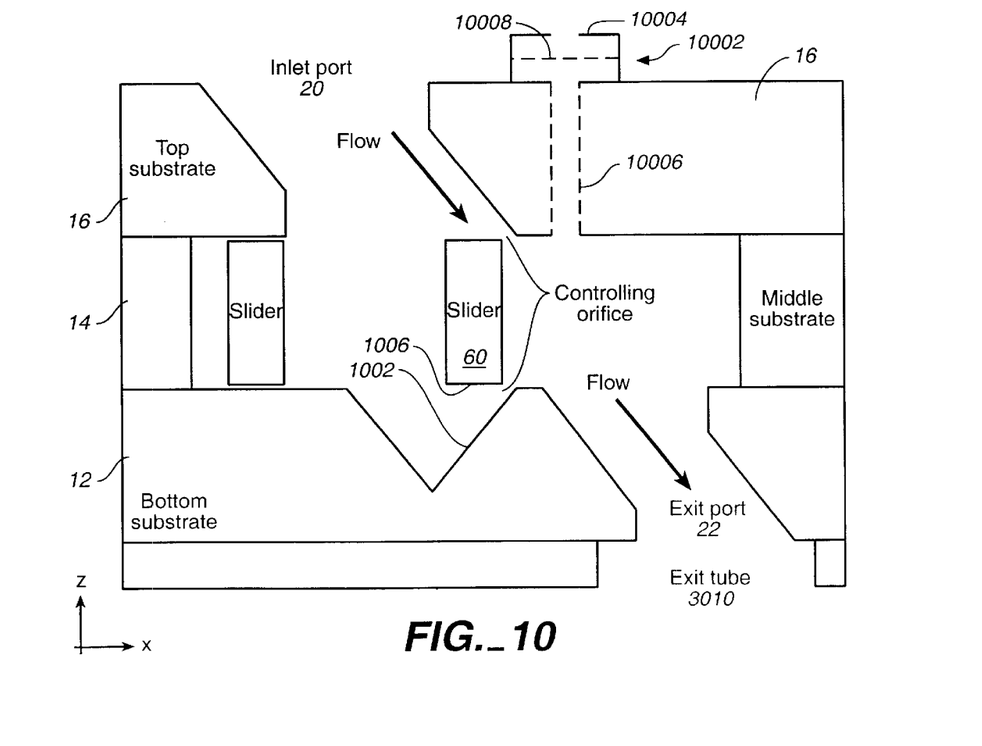
FIG. 10 illustrates a cross-sectional view as in FIG. 1(d) where a channel connects the outlet channel to a differential pressure sensor used to measure flow rate through the valve.

As shown in FIG. 10, a pressure sensor 10002 having diaphragm 10008 may be attached to the top silicon layer such that a feedback control loop may be implemented using the readouts of the pressure sensor. The pressure sensor senses inlet pressure via its inlet 10004 and outlet pressure through channel 10006 elected through the wafer to measure the pressure differential between the inlet and the outlet and derive the fluid flow rate from the pressure differential and the area of the opening exposed by the movement of the displaceable member. The pressure sensor can be integrated into the microvalve design and fabricated on the silicon slider. Alternatively, the pressure sensor may measure the pressure of only the inlet fluid by closing off the outlet of the pressure sensor.

The displaceable member does not require a separate slider attached to the side of the displaceable member. The slider can be the second end portion of the displaceable member, and in this configuration, the second end portion preferably has a cavity through the second end portion that allows fluid to fill the pressure-equalizing contour beneath the second end portion. It is not necessary to provide a cavity, since the pressure-equalizing contour beneath the second end portion can be made sufficiently large and deep that fluid will always remain in the cavity and in communication with fluid in the inlet port regardless whether the displaceable member is opened or closed.

It is not necessary that the valve be configured for high-pressure operation, since the principles of the invention are applicable to low pressure valves as well. The advantages of applying the invention to high-pressure operation are especially great because of the higher pressures that the valve can handle, the ability to use pliable adhesives rather than rigid but brittle adhesives, and the opening, closing, and flow controllability that the invention provides to high-pressure valves.

A valve has been fabricated in which the second end portion of the displaceable member acts as the slider of the microvalve. The displaceable member does not have a cavity that allows fluid to flow through it, nor does the microvalve have a pressure-equalizing contour beneath the displaceable member. This valve is fabricated in accordance with the invention described in copending U.S. Ser. No. 09/148,026. The displaceable member moves over 100 micron.

For the lower-pressure valves, the room-temperature actuator resistance is 187 ohm. Applying a voltage of 20 volts heats the ribs to an average temperature of 100 K above room temperature, increasing the resistance to 292 ohm and yielding a heating power of about 1.4 watt. The microvalve or chip temperature, monitored with an on-chip reference resistor, rises about 45° K. in steady state operation.

Figure 7:
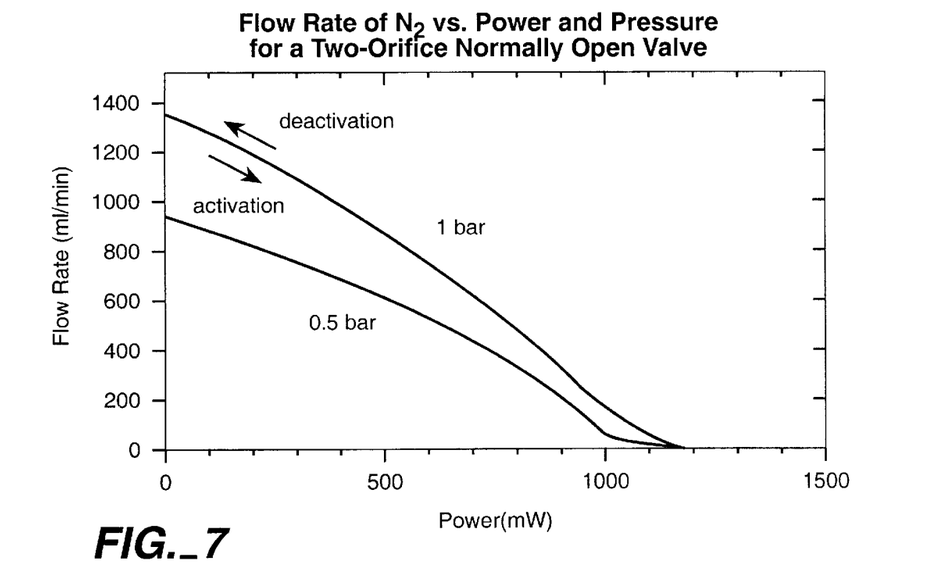
FIG. 7 is a plot of the flow rate of gaseous nitrogen versus power required to operate the microvalve at two pressures. The microvalve is a normally-open microvalve having upper and lower orifices as illustrated in FIG. 1(c) and FIG. 3. No hysteresis is observed in valve operation.
Figure 8:
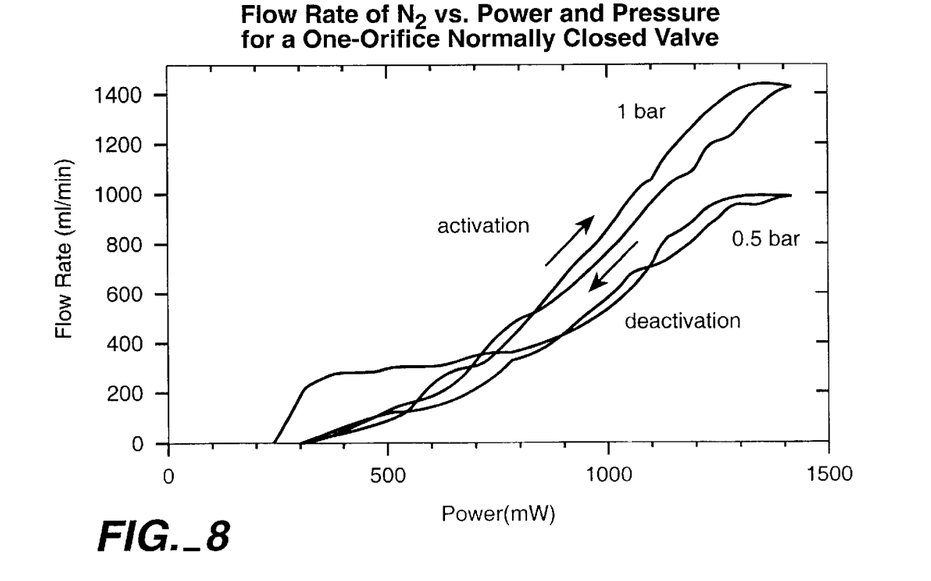
FIG. 8 is a plot of the flow rate of gaseous nitrogen versus power required to operate the microvalve at two pressures, 0.5 bar and 1 bar. This microvalve is a normally-closed microvalve having only an upper orifice (i.e. the opening formed by the edge of the displaceable member closest to the inlet port and the edge of the structure forming the inlet port). Some hysteresis appears to be present from this figure.
Figure 9:
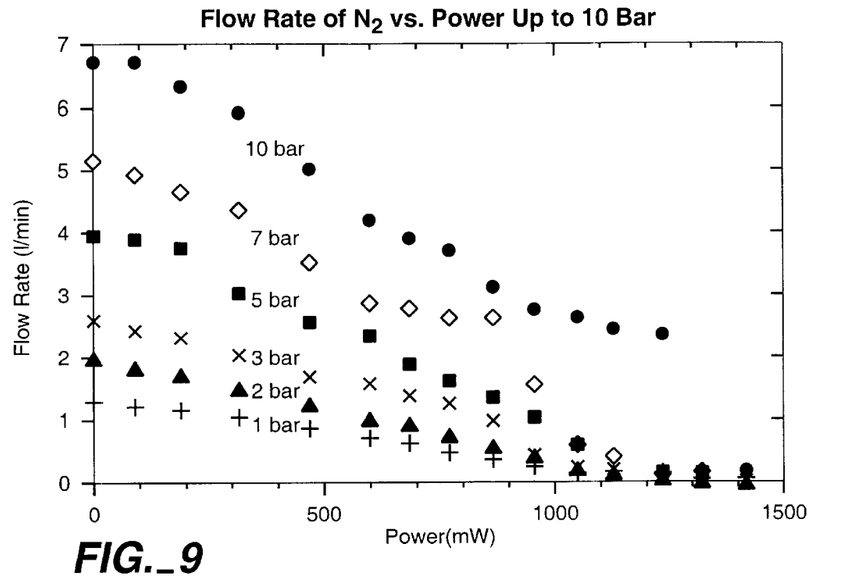
FIG. 9 is a plot of the flow rate of gaseous nitrogen versus power required to operate the microvalve at various pressures from 1 bar to 10 bar.

Flow-rate data for nitrogen (measured at atmospheric pressure) as a function of power is provided in FIG. 7 for a normally open valve with both upper and lower orifices (as illustrated in FIG. 1(c) and FIG. 3) and in FIG. 8 for a normally closed valve with only an upper orifice (as also illustrated in FIG. 1(c). Below 1 bar, there is negligible hysteresis or "stiction" as the normally-open valve is activated and deactivated. Hysteresis is observed for the normally closed valve due to its lack of z-axis pressure-force balancing. Both valves show leakage below 0.2 ml/min (the flowmeter resolution). FIG. 9 shows data for pressures up to 10 bar for the normally-open valve. Hysteresis and leakage can occur at higher pressures where no z-force balancing is present.

Where z-force balancing is present, a normally closed valve has been used to control liquid at a pressure of 13 bar and flow rates up to 300 ml/min.

The valves also have a short response time. The response time is less than 0.5 sec., measured by observing the flowmeter for step changes in input pressure.

What is claimed is:

1. A microvalve comprising a first layer, a second layer, and a third layer, said second layer being disposed between said first layer and said third layer;
   said first layer having a first port therethrough, said third layer having a second port theretrough, and said second layer having a flow area defined therein and positioned so that a fluid flows through said first port, said flow area, and said second port in the absence of an obstruction to flow;
   said second layer having a displaceable member and at least one actuator disposed relative to a first end portion of said member to displace said member in a plane parallel to said second layer, said member being displaceable to selectively and proportionally place a second end portion of said member at a position between an open and a closed position relative to at least one of said first and second ports;
   said first layer having a first pressure-equalizing contour in fluid communication with a first face of said second end portion and in fluid communication with said first port;
   said third layer having a second pressure-equalizing contour in fluid communication with a second face of said second end portion and in fluid communication with said first port;
   and said first and second pressure-equalizing contours each having sufficient depth and length that a fluid filling said first and second pressure-equalizing contours during use provides a pressure force on said first face that counteracts a pressure force on said second face as said second end portion of said member is displaced.

2. The microvalve of claim 1 wherein said second end portion of said member includes a cavity through which fluid in said first pressure-equalizing contour is in pressure communication with fluid in said second pressure-equalizing contour.

3. The microvalve of claim 1 wherein a first tie-rod attaches to said actuator at a first end of said first tie-rod, wherein said first tie-rod attaches to a side of said member at a second end of said first tie-rod, and wherein a second tie-rod is attached at its first end to said member on said side of said member, and wherein said second tie-rod is attached at its second end to said second layer.

4. The microvalve of claim 1 wherein said actuator comprises a plurality of ribs attached at their first ends to the second layer and attached at their second ends to a shaft, and wherein the first and second ends of each of said ribs is narrower than a midpoint section of each of said ribs.

5. The microvalve of claim 3 wherein said actuator comprises a plurality of ribs attached at their first ends to the second layer and attached at their second ends to said first tie-rod, and wherein the first and second ends of each of said ribs are narrower than a midpoint section of each of said ribs.

6. The micirovalve of claim 1 wherein said second pressure-equalizing contour is positioned such that at least a portion of the fluid that flows between said first port and said second port flows into said second pressure-equalizing contour and past said second and portion of said deflectable member as said fluid flows between said first port and said second port.

7. The microvalve of claim 1 wherein said second pressure-equalizing contour is positioned such that said second pressure-equalizing contour is sufficiently obscured by said second end portion of said deflectable member that the fluid does not flow out of said second pressure-equalizing contour when the fluid flows between said first port and said second port.

8. The microvalve of claim 5 wherein said ribs, said first and second tie-rods, and said displaceable member are configured so that said displaceable member and said third layer form an orifice when said displaceable member is positioned to allow the fluid to flow through said microvalve so that said fluid is cooled as it passes through said microvalve.

9. The microvalve of claim 1 wherein said second layer comprises single crystal silicon.

10. The microvalve of claim 1 wherein said first, second, and third layers comprise single crystal silicon.

11. The microvalve of claim 2 wherein said first cavity comprises a portion of said first port.

12. A microvalve for controlling flow of a fluid, said microvalve comprising a body having an inlet, an outlet, a channel in the body in fluid communication between the inlet and outlet, and a flow controller at least partially positioned within the channel; wherein the flow controller comprises a slider having a first face that contacts fluid entering the channel from the inlet and a second face opposite of the first face; wherein the slider is moved to a position by an actuator; wherein the body of the microvalve further has a pressure-equalizing contour communicating with the second face of the slider, said pressure-equalizing contour being sufficiently deep that the slider does not contact the bottom of the pressure-equalizing contour as the slider is opened and shut while fluid flows through the microvalve, and wherein said pressure-equalizing contour is in fluid communication with the inlet of the microvalve regardless of the position of the slider.

13. The microvalve of claim 12 wherein the actuator comprises a plurality of ribs whose first ends are attached to the body of the microvalve and whose second ends are attached to one end of a shaft that is attached at its opposite end to the slider.

14. The microvalve of claim 13 wherein the inlet is positioned on a first face of the microvalve, the outlet is positioned on a second face of the microvalve, and the first and second faces of the microvalve are opposite one another.

15. The microvalve of claim 14 wherein the slider comprises a plate attached to a first end of a lever arm, wherein the actuator is attached to a second end of the lever arm, wherein the plate is positioned to enter the channel, and wherein the slider further comprises a fulcrum engaging the lever arm and attached to the body of the microvalve.

16. The microvalve of claim 15 wherein the first and second ends of each of said ribs are narrower than a midpoint section of each of said ribs.

17. The microvalve of claim 13 wherein said body comprises single crystal silicon.

18. The microvalve of claim 14 wherein the slider has cavity positioned on the slider so that fluid from the inlet is in contact with fluid in said pressure-equalizing equalizing contour through said cavity.

19. The microvalve of claim 15 wherein the plate of the slider has a cavity so that fluid from the inlet is in contact with fluid in said pressure-equalizing contour through said cavity.

20. A method of using the pressure of a fluid to provide a microvalve that is capable of operating at high pressure, the method comprising the steps of:
    providing a housing having a first layer, a second layer, a third layer, an inlet and an outlet;
    placing the inlet in fluid communication with the outlet via a passage between the inlet and outlet;
    providing a slider in the second layer of the housing;
    displacing the slider in a plane defined by the second layer to open and close the microvalve;
    directing fluid at a lower face of the slider in a direction which has at least a component which is perpendicular to the lower face of the slider;
    directing fluid at an upper face of the slider which is opposite of the lower face and in a direction which has at least a component which is perpendicular to the upper face, wherein fluid pressure on the upper and lower faces on the slider is substantially equalized.

21. The method of claim 20 further including the step of placing the fluid directed at the lower face of the slider in pressure communication with the fluid directed at the upper face of the slider through an orifice in the flow controller.

22. The method of claim 20 wherein the step of providing the slider includes etching single crystal silicon to form the slider.

23. The method of claim 20 wherein the step of providing the housing includes forming the inlet and the outlet on opposite sides of the microvalve.

24. A microvalve made by the method of claim 20.

25. microvalve for controlling flow of a fluid and comprising:
    a body having a first layer, a second layer overlaying the first layer, a third layer overlaying the second layer, an inlet, an outlet, and a channel interconnecting the inlet and outlet;
    a flow controller at least partially positioned within the channel and having a first face that contacts fluid entering the channel from the inlet and a second face opposite the first face;
    an actuator for moving the flow controller in the body in a plane defined by the second layer;
    a first pressure-equalizing contour formed in the body and communicating with the first face of the flow controller; and
    a second pressure-equalizing contour formed in the body and communicating with the second face of the flow controller, such that fluid filling the first and second pressure-equalizing contours provides pressure equalizing force on the first and second faces, respectively.

26. The microvalve of claim 25 wherein the first pressure-equalizing contour is formed in the first layer and the second pressure-equalizing contour is formed in the third layer.

27. The microvalve of claim 25 wherein the flow controller includes an aperture through which fluid in the first pressure-equalizing contour is in pressure communication with fluid in the second pressure-equalizing contour.

28. The microvalve of claim 25 further including a first tie rod extending from the actuator to the flow controller and a second tie rod extending from the second layer to the flow controller at a location offset from the first tie rod such that activation of the actuator causes the flow controller to pivot at least partially about second tie rod.

29. The microvalve of claim 28 wherein the actuator comprises a plurality of ribs each extending from the second layer to the first tie-rod, and further wherein an end of each rib is narrower than a respective midpoint of each rib.

30. The microvalve of claim 25 further including a shaft wherein the actuator comprises a plurality of ribs extending from the second layer to the shaft, and further wherein an end of each of the ribs is narrower than a respective midpoint of each of the ribs.

31. The microvalve of claim 25 wherein at least a portion of the fluid that flows between the first port and the second port flows into the second pressure-equalizing contour and past the flow controller as the fluid flows between the first port and the second port.

32. The microvalve of claim 25 wherein the flow controller obscures the second pressure-equalizing contour to prevent fluid from flowing out of the second pressure-equalizing contour when the fluid flows between the first port and the second port.

33. The microvalve of claim 25 wherein the flow controller and the third layer form an orifice to cool fluid that flows therethrough.

34. The microvalve of claim 25 wherein the second layer comprises single crystal silicon.

35. The microvalve of claim 25 wherein the first, second, and third layers comprise single crystal silicon.

* * * * *